(12) United States Patent
Lee

(10) Patent No.: US 7,541,956 B1
(45) Date of Patent: Jun. 2, 2009

(54) INVERTER SYSTEM WITH VARIABLE INPUT GAIN APPARATUS AND METHOD FOR THE SAME

(75) Inventor: Min-Jon Lee, Taoyuan Shien (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 12/023,062

(22) Filed: Jan. 31, 2008

(51) Int. Cl.
*H03M 1/00* (2006.01)

(52) U.S. Cl. .................. 341/139; 341/155; 341/141

(58) Field of Classification Search .................. 341/139, 341/141, 155
See application file for complete search history.

(56) References Cited

U.S. PATENT DOCUMENTS

| | | | | |
|---|---|---|---|---|
| 5,526,126 | A * | 6/1996 | Furihata et al. ............... | 386/22 |
| 6,459,458 | B1 * | 10/2002 | Balaban ...................... | 348/678 |
| 7,030,800 | B2 * | 4/2006 | Arai et al. ................... | 341/155 |
| 2001/0006542 | A1 * | 7/2001 | Ozeki et al. .................. | 375/345 |
| 2007/0258548 | A1 * | 11/2007 | Sutton ......................... | 375/345 |
| 2008/0100485 | A1 * | 5/2008 | Tanaka et al. ............... | 341/141 |

* cited by examiner

*Primary Examiner*—Jean B Jeanglaude

(57) ABSTRACT

An inverter system includes a comparator unit receiving an analog input voltage signal and compared with at least one threshold voltage value to determine a voltage range of the analog input voltage signal. An amplifier unit receives and amplifies the analog input voltage signal. A feedback-controlling gain unit adjusts a voltage gain of the amplifier unit according to the voltage range of the analog input voltage signal. An analog-to-digital converter unit converts an analog signal outputted from the amplifier unit into a digital count. A microcontroller unit is electrically connected with the analog-to-digital converter unit and the comparator unit. The microcontroller unit receives an indicating signal outputted from the comparator unit to know the voltage range of the analog input voltage signal. The microcontroller unit receives a digital count outputted from the analog-to-digital converter unit to correctly calculate an original value of the analog input voltage signal.

10 Claims, 4 Drawing Sheets

INVERTER SYSTEM WITH VARIABLE INPUT GAIN APPARATUS AND METHOD FOR THE SAME

BACKGROUND OF THE INVENTION

1. Field of the Invention

The present invention relates to an inverter system, and more particularly to the inverter system with a variable input gain apparatus and a method for the same.

2. Description of the Prior Art

An inverter is used to convert the direct current (DC) power to the alternating current (AC) power. Therefore, the inverters have been widely applied in solar electricity generating system, motor scooter, uninterruptible power supply, and so on. In an inverter, a voltage/frequency (V/f) control is used to provide variable speed control for motors and consequently inverters can be advantageously applied in refrigeration and air conditioning system, high speed rail system, mass rapid transit system, and so on to promote use efficiency of motors so as to increase energy efficiency.

Reference is made in FIG. 1. It is a block diagram of an inverter system of the prior art. A host 10A delivers an analog control signal to an inverter 30A through an analog input/output module 20A. The inverter 30A includes an analog to digital converter (not shown) to convert the analog control signal into a digital signal, which is processed by a microcontroller unit 300A so as to control the inverter 30A.

At present, the inverters provide control on the frequency of output voltage according to an analog input voltage (between 0 to 10 volts).

However, the analog input voltage has to be processed through a proportional amplifier and then entered into analog input pins of the microcontroller unit 300A. Generally speaking, an operating voltage of the microcontroller unit 300A is +5 volts or +3.3 volts, so the proportional gain is usually a fixed scale-down gain value. Reference is made in FIG. 2. It is a prior art circuit diagram for processing an analog input signal of an analog input/output module. The analog input voltage signal $V_{AI}$ (between 0 to 10 volts) is proportionally transformed into a voltage between 0 to 5 volts through a non-inverting amplifier 22A with a fixed proportional gain P (P=0.5) and the transformed voltage is sent into analog input pins of the microcontroller unit 300A and converted by the analog-to-digital converter unit 24A.

However, in the above-mentioned circuit, accuracy rate of the microcontroller unit 300A is not high when the analog input voltage is lower than +1 volts. FIG. 3 shows a conversion result performed by the circuit in FIG. 2, wherein an analog input voltage signal is converted into a digital count value with 10-bit resolution. A voltage variation is 5 millivolts (mV) (see formula 1) for a least significant bit (LSB) of the analog-to-digital converter unit 24A when a reference voltage $V_{REF}$ thereof is 5.12 volts. If an error of the analog-to-digital converter unit 24A is ±3 LSB, a digital count value N acquired by the microcontroller unit 300A is 100±3 (see formula 2) when the analog input voltage signal is 1.00 volt.

A width of the LSB is 5 mV:

$$\frac{5.12(\text{volt})}{1024} = 5(\text{mV}) \quad \text{(formula 1)}$$

The digital count value N is calculated:

$$N = V_{AI} \times P \times \frac{1024}{V_{REF}} = 1 \times \frac{1}{2} \times \frac{1024}{5.12} = 100 \quad \text{(formula 2)}$$

Hence, the analog input voltage signal $V_{AI}$ can be inversely calculated from the digital count value N:

$$V_{AI} = \frac{N \times V_{REF}/1024}{P} \pm \frac{(3+1/2) \times V_{REF}/1024}{P} \quad \text{(formula 3)}$$

The analog input voltage signal is 1±0.035 volts when the digital count value N acquired by the microcontroller unit 300A is 100. The error of the microcontroller unit 300A is amplified due to the fixed proportional gain P (P=0.5<1), therefore, a maximum error is 0.035 volts. The error rate increases when the analog input voltage is lower; in another word, the accuracy rate decreases when the analog input voltage is lower so that microcontroller unit 300A can't be accurately controlled.

Table 1 obviously shows that the accuracy rate of the microcontroller unit 300A gradually decreases when the analog input voltage decreases.

TABLE 1

Error rate and accuracy rate of the microcontroller for estimating an analog input voltage signal

| Analog input voltage signal ($V_{AI}$) | Error rate of the microcontroller | Accuracy rate of the microcontroller |
| --- | --- | --- |
| 1.00 | 3.5% | 96.5% |
| 0.80 | 4.4% | 95.6% |
| 0.60 | 5.8% | 94.2% |
| 0.40 | 8.8% | 91.3% |
| 0.20 | 17.5% | 82.5% |
| 0.10 | 35.0% | 65.0% |

Hence, in order to increase accuracy rate of the microcontroller unit 300A when the analog input voltage signal is low, a switch circuit with a variable input gain is desirable. The switch circuit with variable input gain selectively increases the analog input voltage to the analog-to-digital converter so as to decrease error rate of the microcontroller unit 300A.

SUMMARY OF THE INVENTION

It is a primary object of the present invention to provide an inverter system with a variable input gain apparatus and a method for the same.

To achieve the primary objective stated above, the present invention provides an inverter system with a variable input gain apparatus. The inverter system comprises a comparator unit, an amplifier unit, a feedback-controlling gain unit, an analog-to-digital converter unit, and a microcontroller unit. The comparator unit receives an analog input voltage signal and compared with at least one threshold voltage value to determine a voltage range of the analog input voltage signal. The amplifier unit receives and amplifies the analog input voltage signal. The feedback-controlling gain unit is electrically connected with the comparator unit and the amplifier unit for adjusting a voltage gain of the amplifier unit according to the voltage range of the analog input voltage signal. The analog-to-digital converter unit is electrically connected with the amplifier unit for converting an analog signal outputted from the amplifier unit into a digital count. The microcontroller unit is electrically connected with the analog-to-digital converter unit and the comparator unit, and the microcontroller unit receives an indicating signal outputted from the comparator unit to acquire the voltage range of the analog input voltage signal and receives a digital count outputted from the analog-to-digital converter unit to correctly calculate an original value of the analog input voltage signal.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
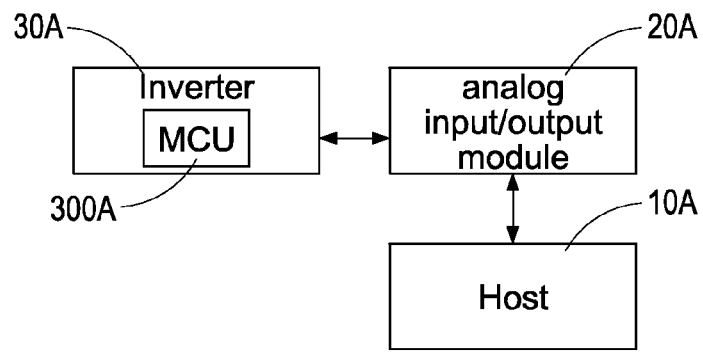
FIG. 1 is a block diagram of a prior art inverter system.
Figure 2:
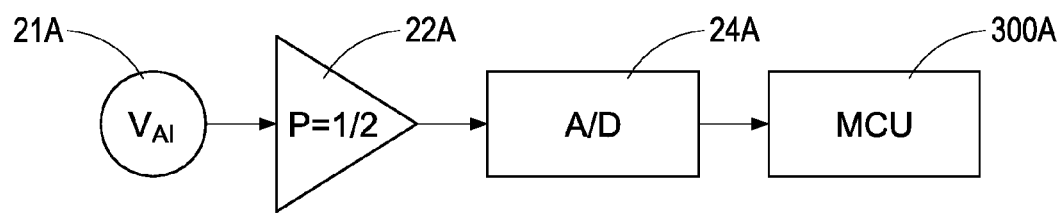
FIG. 2 is a circuit diagram for processing an analog input signal of a prior art analog input/output module.
Figure 3:
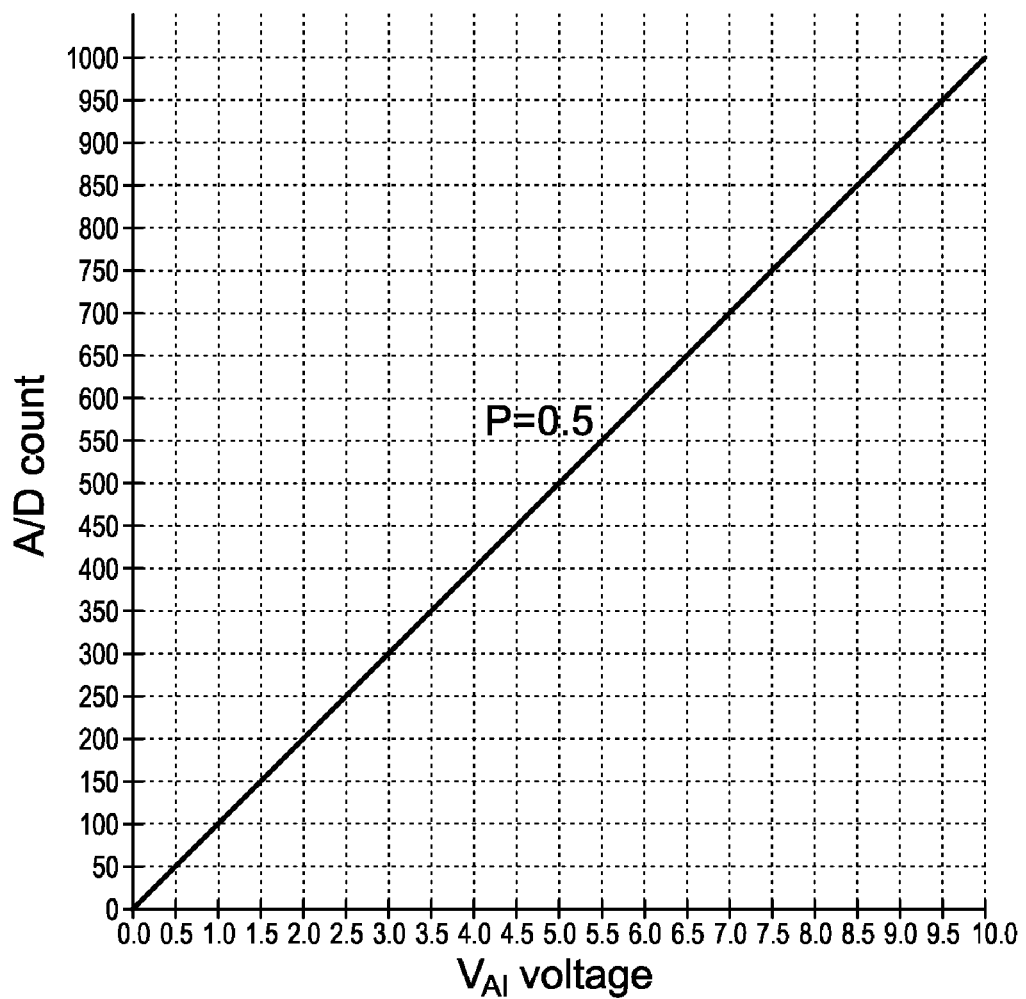
FIG. 3 is a conversion result showing that an analog input voltage signal is converted into a digital count value with 10-bit resolution.
Figure 4:
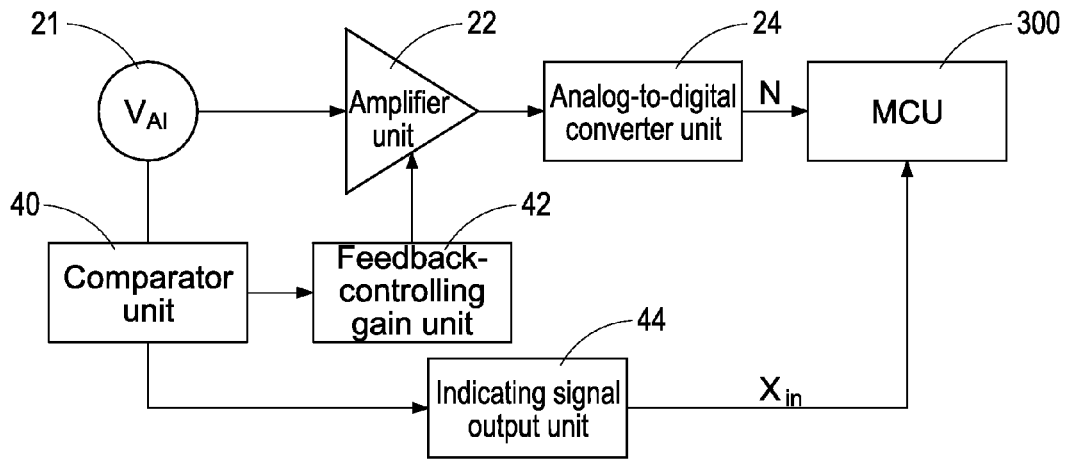
FIG. 4 is a block diagram of a preferred embodiment of an inverter system with a variable input gain apparatus according to the present invention.

Reference is made in FIG. 4. It is a block diagram of a preferred embodiment of an inverter system with a variable input gain apparatus according to the present invention. An analog input voltage signal $V_{AI}$ is amplified by a variable gain unit and processed by an analog-to-digital converter. A microcontroller unit 300 is used to receive a digital count value and an indicating signal Xin to accurately determine an original value of an analog input voltage signal $V_{AI}$. The inverter system mainly comprises a comparator unit 40, a feedback-controlling gain unit 42, and an indicating signal output unit 44, and further comprises an amplifier unit 22 and an analog-to-digital converter unit 24.

The comparator unit 40 compares the analog input voltage signal $V_{AI}$ with at least one threshold voltage value to determine a voltage range for the voltage signal $V_{AI}$. The feedback-controlling gain unit 42 is electrically connected with the comparator unit 40 for adjusting a voltage gain of the amplifier unit 22 according to the voltage range of the analog input voltage signal $V_{AI}$. Specifically, the voltage gain of the amplifier unit 22 is increased by the feedback-controlling gain unit 42 when the voltage range of the analog input voltage signal $V_{AI}$ is smaller, and the voltage gain is decreased when the voltage range of the analog input voltage signal $V_{AI}$ is larger. The signal amplified by the amplifier unit 22 is converted into a digital count value N through an analog-to-digital converter unit 24, and the digital count value N is processed by the microcontroller unit 300. In order to process the digital count value N to correctly calculate input voltage signal $V_{AI}$ (the digital count value N is varied according to a variable input gain P), the indicating signal Xin is also processed by the microcontroller unit 300.

Figure 5:
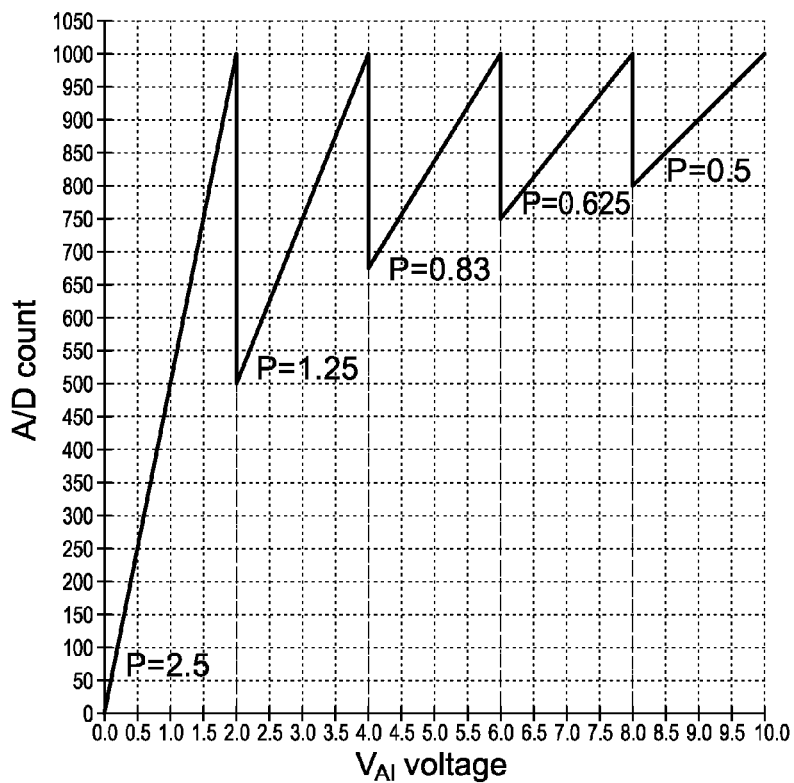
FIG. 5 is a conversion result of converting analog input voltage signal into a digital count value by variable input gain apparatus shown in FIG. 4.

Reference is made in FIG. 5. It is a result graph of converting analog input voltage signal into a digital count value of the FIG. 4 according to the present invention. A full swing voltage of 10V is separated into five voltage intervals: namely, 0-2, 2-4, 4-6, 6-8, and 8-10 (unit in volt) by four threshold voltage values: namely, 2, 4, 6, and 8 (unit in volt). The digital count value N is ranged from 0 to 1023 for the analog-to-digital converter unit 24 with 10-bit resolution. The comparator unit 40 is used to determine a voltage range of the input voltage level so as to acquire the variable input gain P of the amplifier unit 22. The five input gains P are 2.5, 1.25, 0.83, 0.625, and 0.5 separately to correspond to the five voltage intervals, respectively. That is to say, a larger input gain P, such as P=2.5, is provided to decrease the error rate of the microcontroller unit 300 when the voltage range of the analog input voltage signal $V_{AI}$ is small. On the other hand, a smaller input gain P, such as P=0.5, is provided to exceed a rated input value of the microcontroller unit 300. Furthermore, the indicating signal Xin can be processed by the microcontroller unit 300 to acquire the exactly correct analog input voltage signal $V_{AI}$. For example, when the digital count value N received by the microcontroller unit 300 is 850, the analog input voltage signal $V_{AI}$ corresponded can be 1.75, 3.4, 5, 6.75, and 8.5 (unit in volt). However, the analog input voltage signal $V_{AI}$ is certainly 3.4, when the indicating signal Xin indicates that the analog input voltage signal $V_{AI}$ belongs to the second voltage interval, namely, 2-4 (unit in volt).

Figure 6:
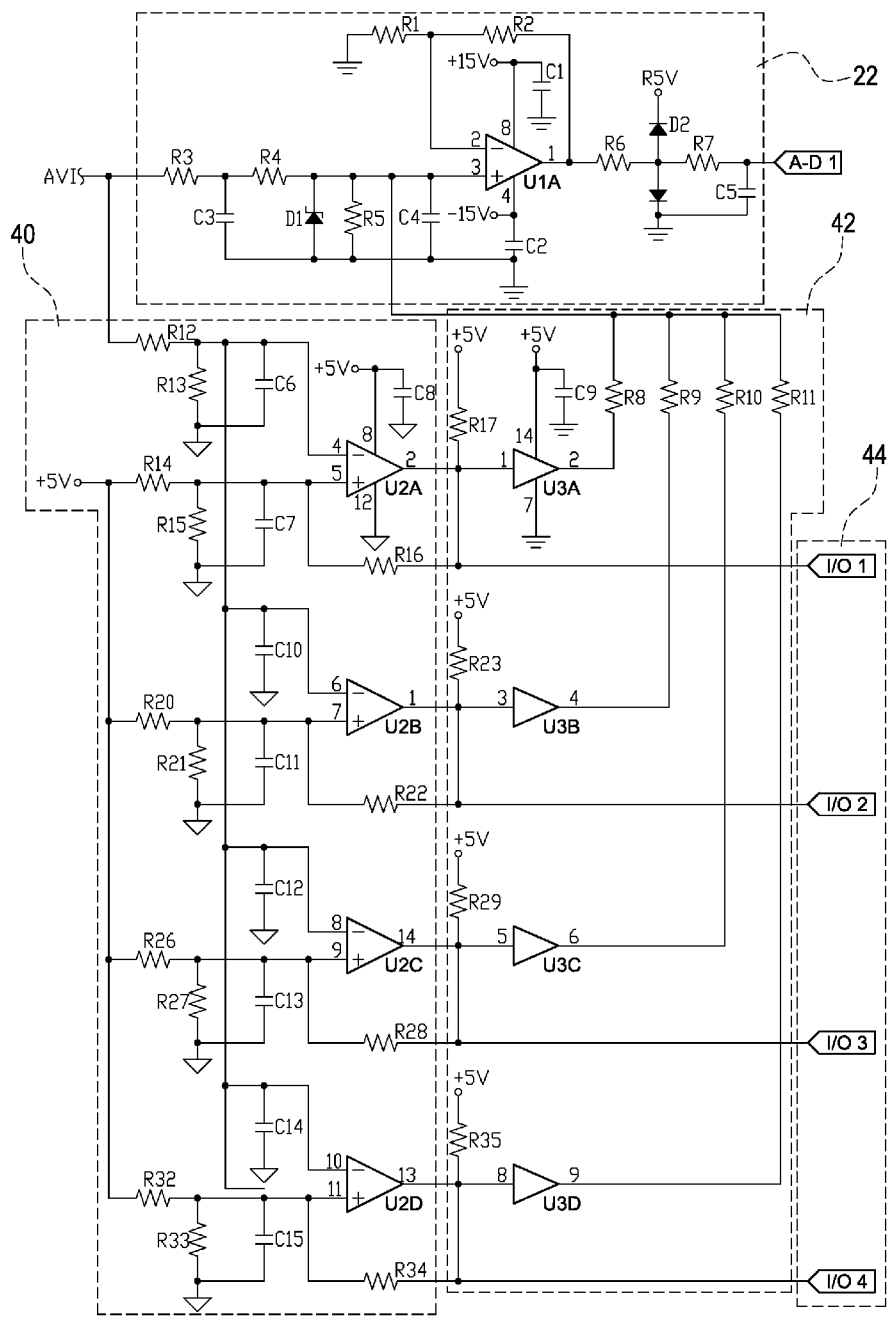
FIG. 6 is a circuit diagram for implementing the inverter system with the variable input gain apparatus of the FIG. 4.

Reference is made in FIG. 6. It is a circuit diagram for implementing the inverter system with the variable input gain apparatus of the FIG. 4 according to the present invention. The comparator unit 40 can be a comparator circuit comprised of four comparators U2A, U2B, U2C, and U2D, and a non-inverting input end of each of the four comparators U2A, U2B, U2C, and U2D is connected with different voltage levels, which correspond to the threshold voltage values, such as 2 volts, 4 volts, 6 volts, and 8 volts. The feedback-controlling gain unit 42 comprises four non-inverting drivers U3A, U3B, U3C, U3D and four resistors R8, R9, R10, R11 electrically connected with the four comparators U2A, U2B, U2C, and U2D separately. The amplifier unit 22 includes an amplifier U1A which is a non-inverting amplifier with a fixed gain. When an input voltage level of the analog input voltage signal $V_{AI}$ is larger than a specific threshold voltage value, one of the corresponding comparators U2A, U2B, U2C, and U2D produces a low voltage level signal. The microcontroller unit 300 acquires a range of the input voltage level of the analog input voltage signal $V_{AI}$ through the indicating signal output unit 44 that is composed of outputs of the comparators U2A, U2B, U2C, and U2D. In addition, the corresponding comparators U2A, U2B, U2C, and U2D drives the corresponding non-inverting driver U3A, U3B, U3C, U3D to increase an input current of the analog input voltage signal $V_{AI}$ through resistors R3 and R4 and thus causes a larger voltage drop so as to decrease a input voltage of the non-inverting input end of the amplifier unit 22. Therefore, it is to be equal to decrease the gain value P so that the input voltage level of the analog input voltage signal $V_{AI}$ is inverse proportion to the gain value P.

As shown in FIG. 6, a 5-section voltage gain can be switched by using an amplifier unit wherein four amplifiers are included, four non-inverting drivers and appropriate matching resistors. That is to say, a n-section voltage gain can be designed by using an amplifier unit wherein n−1 amplifiers are included, n−1 non-inverting drivers and appropriate matching resistors. The circuit shown in FIG. 6 has been described with reference to the preferred embodiment thereof, it will be understood that the invention is not limited to the details thereof. Table 2 shows an operating result of the inverter system with the variable input gain apparatus according to the present invention and explains an excellent accuracy rate of the microcontroller for estimating a wide range of the analog input voltage signal.

TABLE 2

Error rate and accuracy rate of the microcontroller for estimating an analog input voltage signal

| analog input voltage signal ($V_{AI}$) | Error rate of the microcontroller | Accuracy rate of the microcontroller |
|---|---|---|
| 1.00 | 0.7% | 99.3% |
| 0.80 | 0.9% | 99.1% |
| 0.60 | 1.2% | 98.8% |
| 0.40 | 1.8% | 98.2% |
| 0.20 | 3.5% | 96.5% |
| 0.10 | 7.0% | 93.0% |

It follows from what has been said that the present invention has the following advantages:

1. Precise control of the inverter is achieved when the input voltage level of the analog input voltage signal is low.
2. Accuracy rate of estimating the analog input voltage signal for the microcontroller is raised.
3. Efficiency of the firmware filtering is promoted.
4. The circuit structure is simple to easily implement.
5. All these components used are less to bring lower cost.
6. Flexibility of the circuit design for determining a range of the input voltage level is excellent.
7. A wide scope of application is provided.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A variable input gain apparatus of an inverter system, the variable input gain apparatus processing an analog input voltage signal and delivering the processed signal to the inverter system, the variable input gain apparatus comprising:
    a comparator unit for receiving the analog input voltage signal and compared with at least one threshold voltage value to determine a voltage range of the analog input voltage signal;
    an amplifier unit for receiving and amplifying the analog input voltage signal;
    a feedback-controlling gain unit electrically connected with the comparator unit and the amplifier unit, the feedback-controlling gain unit adjusting a voltage gain of the amplifier unit according to the voltage range of the analog input voltage signal; and
    an analog-to-digital converter unit electrically connected with the amplifier unit and converting an analog signal outputted from the amplifier unit into a digital count;
    wherein the comparator unit outputs an indicating signal to indicate the voltage range of the analog input voltage signal.
2. The variable input gain apparatus in claim 1, wherein the comparator unit comprises a plurality of comparators, and each of the comparators receives the analog input voltage signal from one input end thereof and receives the threshold voltage value from the other input end thereof.
3. The variable input gain apparatus in claim 2, wherein the feedback-controlling gain unit comprises a plurality of non-inverting amplifiers and a plurality of resistors, and each of the non-inverting amplifiers is connected between the corresponded comparator and the corresponded resistor and connected with the amplifier unit via the corresponded resistor.
4. An inverter system with a variable input gain for processing an analog input voltage signal by varying a voltage gain thereof, comprising:
    a comparator unit receiving the analog input voltage signal and comparing the analog input voltage signal with at least one threshold voltage value to determine a voltage range of the analog input voltage signal;
    an amplifier unit receiving and amplifying the analog input voltage signal;
    a feedback-controlling gain unit electrically connected with the comparator unit and the amplifier unit and adjusting a voltage gain of the amplifier unit according to the voltage range of the analog input voltage signal;
    an analog-to-digital converter unit electrically connected with the amplifier unit and converting an analog signal outputted from the amplifier unit into a digital count; and
    a microcontroller unit electrically connected with the analog-to-digital converter unit and the comparator unit, the microcontroller unit receiving an indicating signal outputted from the comparator unit to know the voltage range of the analog input voltage signal and receiving a digital count outputted from the analog-to-digital converter unit to correctly calculate an original value of the analog input voltage signal.
5. The inverter system in claim 4, wherein the comparator unit comprises a plurality of comparators, and each of the comparators receiving the analog input voltage signal from one input end thereof and receiving the threshold voltage value from another input end thereof.
6. The inverter system in claim 5, wherein the feedback-controlling gain unit comprises a plurality of non-inverting amplifiers and a plurality of resistors, and each of the non-inverting amplifiers is connected between the corresponded comparator and the corresponded resistor and connected with the amplifier unit via the corresponded resistor.
7. A method for processing an analog input voltage signal of an inverter system, comprising:
    setting at least one threshold voltage value;
    determining a voltage range of the analog input voltage signal according to the threshold voltage value;
    determining a voltage gain of the analog input voltage signal according to the voltage range;
    amplifying the analog input voltage signal by the voltage gain; and
    converting the amplified analog input voltage signal into a digital count.
8. The method as claimed in claim 7, further comprising:
    outputting an indicating signal to indicate the voltage range of the analog input voltage signal.
9. The method as claimed in claim 7, wherein the voltage gain is decreased when the voltage range of the analog input voltage signal is larger than the threshold voltage value.
10. The method as claimed in claim 7, wherein the voltage gain is increased when the voltage range of the analog input voltage signal is smaller than the threshold voltage value.

* * * * *